United States Patent
Kameyama et al.

(10) Patent No.: US 9,633,997 B2
(45) Date of Patent: Apr. 25, 2017

(54) SEMICONDUCTOR DEVICE AND METHOD FOR MANUFACTURING SEMICONDUCTOR DEVICE

(71) Applicants: Satoru Kameyama, Toyota (JP); Shinya Iwasaki, Toyota (JP); Yuki Horiuchi, Toyota (JP); Shuhei Oki, Nagakute (JP)

(72) Inventors: Satoru Kameyama, Toyota (JP); Shinya Iwasaki, Toyota (JP); Yuki Horiuchi, Toyota (JP); Shuhei Oki, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/114,201

(22) PCT Filed: Sep. 8, 2014

(86) PCT No.: PCT/JP2014/073641
§ 371 (c)(1),
(2) Date: Jul. 26, 2016

(87) PCT Pub. No.: WO2015/118713
PCT Pub. Date: Aug. 13, 2015

(65) Prior Publication Data
US 2017/0012039 A1 Jan. 12, 2017

(30) Foreign Application Priority Data

Feb. 10, 2014 (JP) ................................ 2014-023873

(51) Int. Cl.
*H01L 29/76* (2006.01)
*H01L 27/06* (2006.01)
(Continued)

(52) U.S. Cl.
CPC .... *H01L 27/0664* (2013.01); *H01L 21/02675* (2013.01); *H01L 21/265* (2013.01);
(Continued)

(58) Field of Classification Search
CPC ............. H01L 27/0664; H01L 27/0652; H01L 27/0629; H01L 29/0684; H01L 29/1095;
(Continued)

(56) References Cited

U.S. PATENT DOCUMENTS

2006/0252239 A1   11/2006   Hierlemann
2007/0257315 A1   11/2007   Bedell et al.
(Continued)

FOREIGN PATENT DOCUMENTS

EP         2674967 A1    12/2013
JP       2011-082220 A    4/2011
(Continued)

*Primary Examiner* — Kevin M Picardat
(74) *Attorney, Agent, or Firm* — Oliff PLC

(57) ABSTRACT

A semiconductor device, in which, in a density distribution of first conductivity type impurities in the first conductivity type region measured along a thickness direction of the semiconductor substrate, a local maximum value N1, a local minimum value N2, a local maximum value N3, and a density N4 are formed in this order from front surface side, a relationship of N1>N3>N2>N4 is satisfied, a relationship of N3/10>N2 is satisfied, and a distance "a" from the surface to the depth having the local maximum value N1 is larger than twice a distance "b" from the depth having the local maximum value N1 to the depth having the local minimum N2.

6 Claims, 6 Drawing Sheets

(51) Int. Cl.

| | |
|---|---|
| *H01L 21/02* | (2006.01) |
| *H01L 21/8222* | (2006.01) |
| *H01L 21/265* | (2006.01) |
| *H01L 21/324* | (2006.01) |
| *H01L 29/10* | (2006.01) |
| *H01L 29/06* | (2006.01) |
| *H01L 29/739* | (2006.01) |
| *H01L 29/861* | (2006.01) |
| *H01L 29/08* | (2006.01) |
| *H01L 21/425* | (2006.01) |

(52) U.S. Cl.
CPC ........ *H01L 21/324* (2013.01); *H01L 21/8222* (2013.01); *H01L 27/0629* (2013.01); *H01L 29/0684* (2013.01); *H01L 29/1095* (2013.01); *H01L 21/425* (2013.01); *H01L 29/0821* (2013.01); *H01L 29/0839* (2013.01); *H01L 29/7397* (2013.01); *H01L 29/8611* (2013.01)

(58) Field of Classification Search
CPC ............. H01L 29/0821; H01L 29/0839; H01L 29/7397; H01L 29/8611; H01L 21/02675; H01L 21/265; H01L 21/324; H01L 21/425
USPC .......................................................... 257/66
See application file for complete search history.

(56) References Cited

U.S. PATENT DOCUMENTS

| | | | |
|---|---|---|---|
| 2009/0053878 A1* | 2/2009 | Kelman | H01L 21/0242 438/509 |
| 2010/0084583 A1 | 4/2010 | Hatem et al. | |
| 2010/0084613 A1* | 4/2010 | Maxwell | H01L 21/324 252/500 |
| 2010/0084734 A1* | 4/2010 | Momo | H01L 21/76254 257/506 |
| 2010/0308446 A1 | 12/2010 | Nakamura | |
| 2014/0306267 A1 | 10/2014 | Kameyama | |
| 2015/0001615 A1* | 1/2015 | Yong | H01L 21/265 257/330 |

FOREIGN PATENT DOCUMENTS

| | | |
|---|---|---|
| JP | 2013-138252 A | 7/2013 |
| JP | 5742962 B2 | 7/2015 |
| TW | 200644091 A | 12/2006 |
| TW | 200807571 A | 2/2008 |
| TW | 201032264 A | 9/2010 |

* cited by examiner

SEMICONDUCTOR DEVICE AND METHOD FOR MANUFACTURING SEMICONDUCTOR DEVICE

CROSS REFERENCE TO RELATED APPLICATION

This application is a related application of Japanese Patent Application No. 2014-023873 filed on Feb. 10, 2014 and claims priority thereto, the entire contents described in the Japanese Patent Application are hereby incorporated by reference into the present application.

TECHNICAL FIELD

The technique disclosed herein relates to a semiconductor device.

BACKGROUND ART

Japanese Patent Application Publication No. 2011-82220 (hereinbelow referred to as Patent Literature 1) discloses an RC-IGBT (Reverse Conducting Insulated Gate Bipolar Transistor) in which a diode and an IGBT are provided in a single semiconductor substrate. An n-type cathode layer is provided in a range exposed on a lower surface of the diode. An n-type buffer layer is provided above the cathode layer. An n-type drift layer is provided above the buffer layer. An n-type impurity density of the drift layer is lower than those of the buffer layer and the cathode layer. The n-type impurity density of the buffer layer is lower than that of the cathode layer.

SUMMARY

Technical Problem

As in Patent Literature 1, a structure in which a high density impurity region, an intermediate density impurity region, and a low density impurity region are arranged in this order from a surface side of the substrate is widely used in a variety of semiconductor devices, such as diodes, MOSFETS, and the like. In this disclosure, a technique that enables to further stabilize properties of a semiconductor device as aforementioned will be provided.

Solution to Problem

The inventors of the present application study the techniques that can further increase an impurity density of the aforementioned high density impurity region. In this technique, impurities are implanted in a vicinity of a surface of a semiconductor substrate, after which a region in the vicinity of the surface is melted, and thereafter solidified again. Since the impurities are diffused over an entirety of the melted region, the region that has again been solidified becomes a region containing the impurities at a high density. Further, when the semiconductor substrate is melted as above, crystal defects that were generated in the high-density impurity implantation can effectively be vanished. Thus, it becomes possible to form a high density impurity region having a high impurity density and a low crystal defect density. However, in a technique that melts the surface of the semiconductor substrate as above, a phenomenon that impurities that had been adhering to the surface of the semiconductor substrate prior to the melting diffuses into the melted region is starting to gain recognition. For example, upon forming an n-type high density impurity region, there are cases where p-type impurities had been adhering to the surface of the semiconductor substrate diffuses within the melted region. In such cases, if the n-type impurity density is low at a boundary between the high density impurity region and the intermediate density impurity region, the p-type impurities are diffused in the aforementioned region having the low n-type impurity density, and there is a case where that region becomes a p-type region. To solve such a problem, the n-type impurity density at the boundary between the high density impurity region and the intermediate density impurity region is required to be high. However, if the n-type impurity density at the boundary is high, the high density impurity region and the intermediate density impurity region are not sufficiently separated. In this case, an inflow efficiency of electrons into the high density impurity region changes due to being influenced by both the high density impurity region and the intermediate density impurity region. Due to this, it becomes difficult to control properties of the semiconductor device.

Therefore, this description provides a semiconductor device as below. This semiconductor device comprises a first conductivity type region exposed on a surface of a semiconductor substrate. A local maximum value N1, a local minimum value N2, and a local maximum value N3 exist in a density distribution of first conductivity type impurities in the first conductivity type region measured along a thickness direction of the semiconductor substrate. A depth having the local maximum value N1 is located on the surface side with respect to a depth having the local minimum value N2. A depth having the local maximum value N3 is located on an opposite side of the surface with respect to the depth having the local minimum value N2. A region having a density N4 of the first conductivity type impurities is located in a part of the first conductivity type region located on an opposite side of the surface with respect to the depth having the local maximum value N3. A relationship of N1>N3>N2>N4 is satisfied. A relationship of N3/10>N2 is satisfied. A distance "a" from the surface to the depth having the local maximum value N1 is larger than twice a distance "b" from the depth having the local maximum value N1 to the depth having the local minimum value N2.

Notably, the aforementioned first conductivity type impurities are of an n-type or a p-type. Further, the density of the region having the density N4 does not need to be uniform, but the density N4 in the region may vary depending on positions within a range that satisfies a relationship of N2>N4.

In this semiconductor device, the distance "a" from the surface of the semiconductor substrate to the depth having the local maximum value N1 is larger than twice the distance "b" from the depth having the local maximum value N1 to the depth having the local minimum N2. Such an impurity distribution is called a box profile, and is a distribution characteristically obtained by the aforementioned method of activating the impurities by melting the semiconductor substrate. In this semiconductor device, the region having the local maximum value N1 corresponds to the high density region, the region having the local maximum value N3 corresponds to the intermediate density region, and the region having the density N4 corresponds to the low density region. Further, the depth having the local minimum value N2 corresponds to a boundary between the high density region and the intermediate density region. In this semiconductor device, the local minimum value N2 is higher than the density N4. Due to this, even if impurities having a conductivity type (which is herein referred to as a second conductivity type) that is different from the first conductivity type are diffused within the depth of the local minimum value N2 in a manufacturing process for this semiconductor device (that is, upon melting the semiconductor substrate), the region at this depth less likely becomes a second conductivity type region. That is, in this semiconductor device, the second conductivity type region is less likely to be formed at the boundary between the high density region and the intermediate density region. Further, the relationship of N3/10>N2 is satisfied in the semiconductor device. When the local minimum value N2 is at a low density at the aforementioned degree, the high density region and the intermediate density region are sufficiently separated, and the influences exerted upon each other between these regions can be suppressed. Due to this, the inflow efficiency of electrons into the high density impurity region comes to be determined by the impurity density of the high density impurity region with hardly any influence from the intermediate density impurity region. As above, according to this semiconductor device, the formation of the second conductivity type region at the boundary can be suppressed, and the influence of the intermediate density impurity region on the inflow efficiency of electrons into the high density impurity region can be suppressed. Thus, the properties of the semiconductor device are stabilized even in the event of mass production.

Furthermore, this disclosure provides a method for manufacturing a semiconductor device. This method comprises a first implantation for implanting first conductivity type impurities into a surface of a semiconductor substrate of a first conductivity type, heat treating the semiconductor substrate after the first implantation at a temperature at which the semiconductor substrate does not melt, a second implantation for implanting first conductivity type impurities into the surface of the semiconductor substrate at an energy lower than in the first implantation and at a density higher than in the first implantation, and melting, after the second implantation, a region located on the surface side with respect to an average position of positions at which the first conductivity type impurities stop in the first implantation and then solidifying the region.

Notably, so long as the heat treatment is performed after the first implantation, and the melting and solidifying are performed after the second implantation, the orders by which the first implantation, the heat treatment, the second implantation and the melting and solidifying may be of any order.

In this method, the first conductivity type impurities are implanted at a relatively deep position in the first implantation, and the first conductivity type impurities that were implanted in the first implantation are activated in the heat treatment. Due to this, an intermediate density region is formed. Further, in this method, the first conductivity type impurities are implanted at a relatively shallow position in the second implantation, and the first conductivity type impurities that were implanted in the second implantation are activated in the melting and solidifying. Due to this, a high density region is formed. A region where the first conductivity type impurities did not diffuse becomes a low density region. According to this manufacturing method, a semiconductor device including the high density region, the intermediate density region, and the low density region can be manufactured.

DETAILED DESCRIPTION

Some features of embodiments described hereinbelow will be described below. Notably, the features hereinbelow are each useful independently on their own.

Feature 1

A depth having a density N5 of the first conductivity type impurities may be located on the surface side with respect to the depth having the local maximum value N1. The density N5 may be one tenth of the local maximum value N1. A distance "c" from the depth having the density N5 to the depth having the local maximum value N1 may be larger than twice the distance "b".

Feature 2 a diode and an IGBT may be provided in the semiconductor substrate, and the first conductivity type region may be a cathode region of the diode.

Feature 3

The depth having the local maximum value N1 may be present in a range of 0.3 to 0.7 µm from a surface.

Feature 4

A depth having the local maximum value N3 may be present in a range of 0.5 to 3.0 µm from the surface.

First Embodiment

Figure 1:
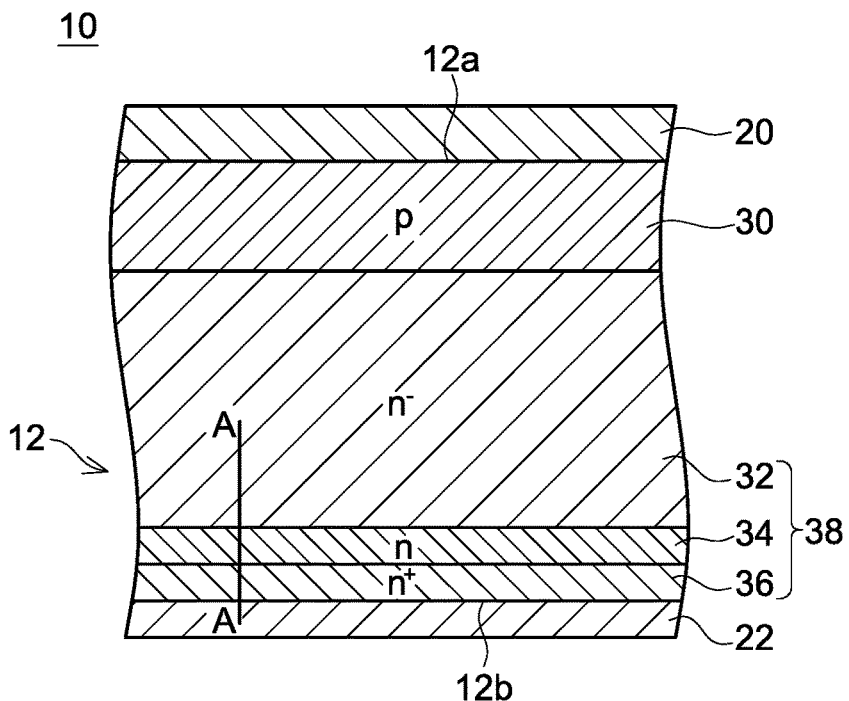
FIG. 1 is a vertical cross sectional view of a semiconductor device 10 of a first embodiment.

A semiconductor device 10 of a first embodiment shown in FIG. 1 includes a semiconductor substrate 12, an anode electrode 20 provided on an upper surface 12a of the semiconductor substrate 12, and a cathode electrode 22 provided on a lower surface 12b of the semiconductor substrate 12.

The semiconductor substrate 12 includes therein a p-type anode region 30 and art n-type cathode region 38. The anode region 30 is provided in a range exposed on the upper surface 12a of the semiconductor substrate 12, and is connected to the anode electrode 20. The cathode region 38 is provided in a range exposed on the lower surface 12b of the semiconductor substrate 12, and is connected to the cathode electrode 22. That is, a diode is provided in the semiconductor substrate 12.

Figure 2:
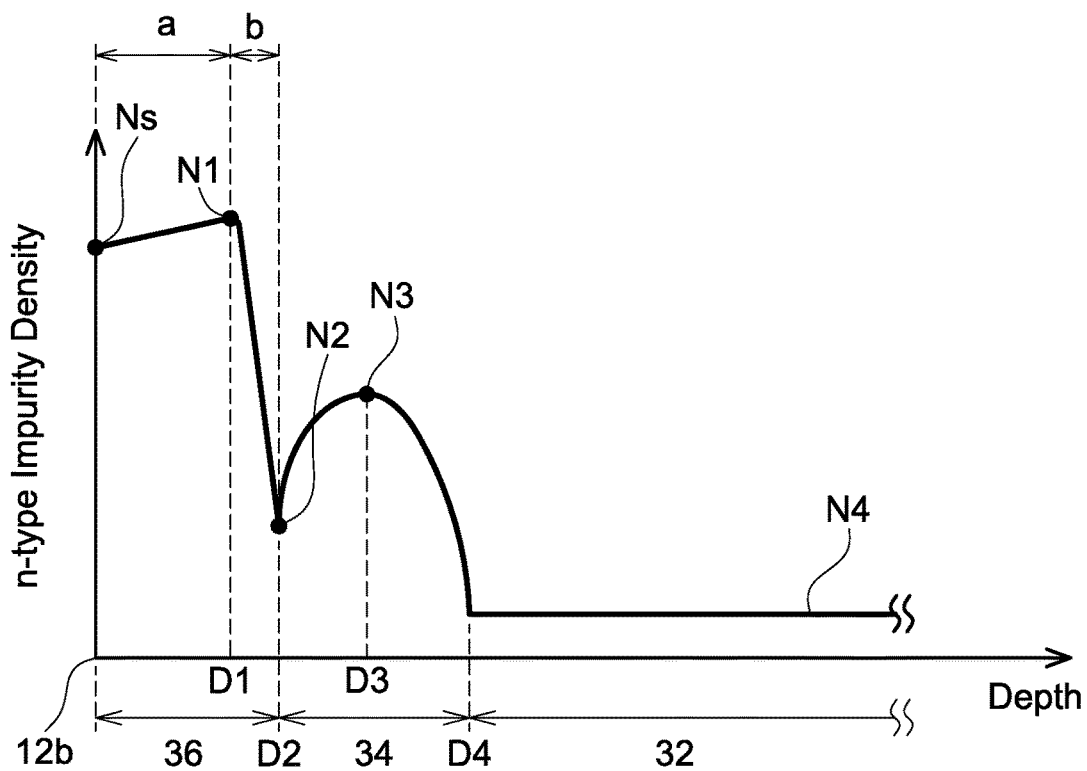
FIG. 2 is a graph showing an n-type impurity density along a line A-A in FIG. 1.

FIG. 2 shows a density distribution of n-type impurities along a line A-A in FIG. 1. Notably, a horizontal axis of FIG. 2 indicates a depth from the lower surface 12b of the semiconductor substrate 12, and a vertical axis designates an n-type impurity density in logarithmic expressions. The n-type impurity density rises moderately from the lower surface 12b of the semiconductor substrate 12 toward a deeper side, and comes to be of a local maximum value N1. The n-type impurity density steeply drops from a depth D1 having the local maximum value N1 toward the deeper side, and comes to be of a local minimum value N2. The n-type impurity density rises from a depth D2 having the local minimum value N2 toward the deeper side, and comes to be of a local maximum value N3. The n-type impurity density drops from a depth D3 having the local maximum value N3 toward the deeper side, and comes to of a density N4 at a depth D4. In a region deeper than the depth D4, the n-type impurity density stays substantially constant at the density N4. The densities N1 to N4 satisfy a relationship of N1>N3>N2>N4. Further, the local minimum value N2 is a value smaller than one-tenth of the local maximum value N3. That is, a relationship of N3/10>N2 is satisfied. Further, an n-type impurity density Ns at the lower surface 12b of the semiconductor substrate 12 is a value greater than one-tenth of the local maximum value N1. Hereinbelow, the cathode region 38 located on a shallower side than the depth D2 (lower surface 12b side) will be termed a contact region 36, the cathode region 38 between the depth D2 and the depth D4 will be termed a buffer region 34, and the cathode region 38 on the deeper side than the depth D4 (upper surface 12a side) will be termed a drift region 32. In the present embodiment, the depth D1 is 0.3 to 0.7 μm, and the depth. D3 is 0.5 to 3.0 μm.

A distance "a" (=D1) between the lower surface 12b and the depth D1 is larger than twice a distance "b" (=D2−D1) between the depth D1 and the depth D2. That is, a>2b is satisfied. That is, an n-type impurity density distribution in the contact region 36 has a box profile. That is, the contact region 36 is formed by melting a semiconductor region to which the n-type impurities had been implanted and thereafter solidifying (recrystallizing) it. Due to this, in the contact region 36, its crystal defect density is low despite its high n-type impurity density.

In the buffer region 34, the n-type impurity density varies moderately as compared to a range in the aforementioned distance "b" (range between the depth D1 and the depth D2). In the buffer region 34, the n-type impurities are distributed in a form of a Gauss distribution. The buffer region 34 is a region formed by implanting the n-type impurities at the depth D3 and thereafter diffusing and activating the n-type impurities by heat treatment.

When the diode turns on (that is, when a forward voltage is applied to the diode), holes flow from the anode electrode 20 toward the cathode electrode 22, and electrons flow from the cathode electrode 22 toward the anode electrode 20. As above, since the contact region 36 has the high n-type impurity density, a resistance between the contact region 36 and the cathode electrode 22 is extremely low. Due to this, the electrons flow from the cathode electrode 22 into the contact region 36 with a high inflow efficiency. Further, since the crystal defect density of the contact region 36 is low, a loss is less likely to occur in the contact region when the electrons and holes pass through the contact region 36. Due to this, the diode can operate at a low loss.

When the diode turns off (that is, when a reverse voltage is applied to the diode), a depletion layer extends from a pn junction at a boundary between the anode region 30 and the drift region 32. Since the n-type impurity density in the buffer region 34 is relatively high, the depletion layer stops within the buffer region 34. Due to this, the depletion layer is prevented from reaching the contact region 36, as a result of which a voltage resistance of the diode is ensured.

Further, in a manufacturing process, if a scar occurs on the lower surface 12b of the semiconductor substrate 12 and if the scar reaches the buffer region 34, the voltage resistance of the diode is deteriorated. However, in this semiconductor device 10, the buffer region 34 is provided at a relatively deep position. More specifically, the depth D3 is arranged to be located at 0.5 to 3.0 μm. Due to this, even if a scar occurs in the lower surface 12b, the scar is less likely to reach the buffer region 34. Due to this, a voltage resistance deterioration by the scar is less likely to occur.

Figure 3:
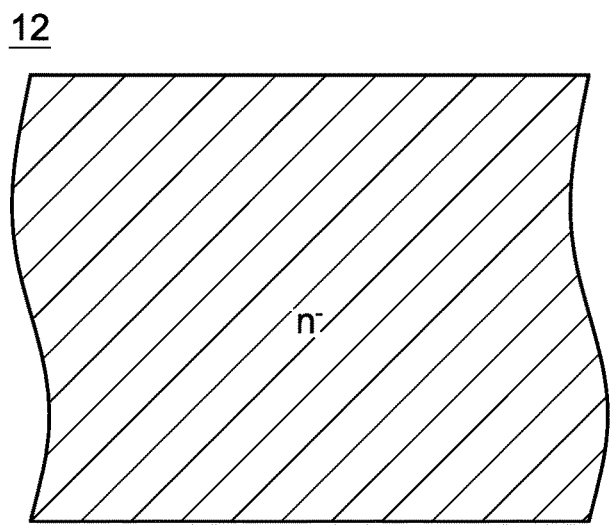
FIG. 3 is an explanatory diagram of a manufacturing process of the semiconductor device 10.

Next, a manufacturing method of the semiconductor device 10 will be described. Firstly, the n-type semiconductor substrate 12 shown in FIG. 3 is prepared. At this stage, an entirety of the semiconductor substrate 12 has the n-type impurity density that is equal to the aforementioned density N4.

Buffer Implantation

Figure 4:
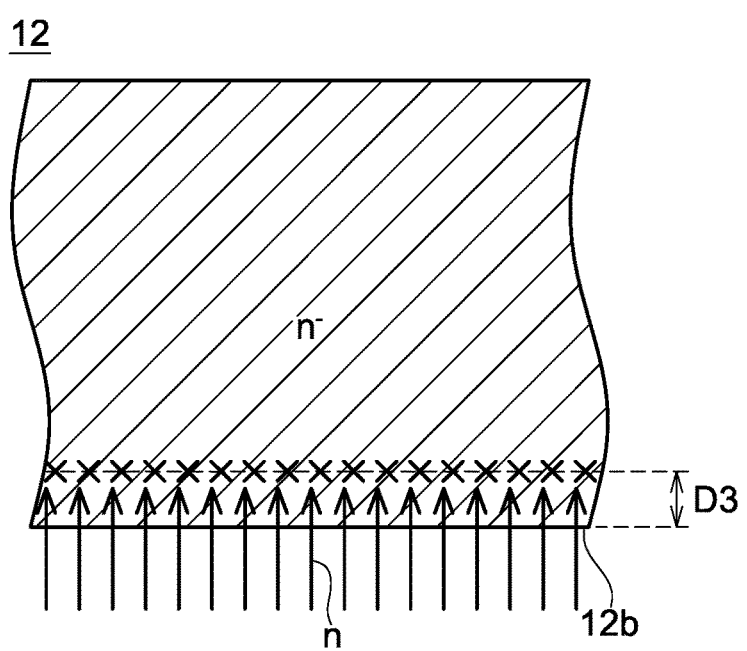
FIG. 4 is an explanatory diagram of the manufacturing process of the semiconductor device 10.

Next, as shown in FIG. 4, the n-type impurities are implanted to a rear surface of the semiconductor substrate 12. Here, implantation energy is adjusted so that an average position of positions at which the n-type impurities are implanted is located at the depth D3 from the lower surface 12b of the semiconductor substrate 12.

Buffer Anneal

Figure 5:
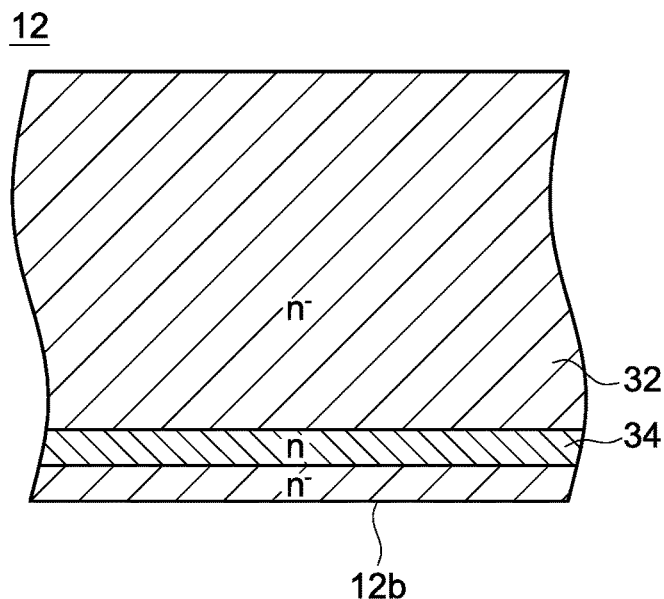
FIG. 5 is an explanatory diagram of the manufacturing process of the semiconductor device 10.

Next, the semiconductor substrate 12 is annealed by using a furnace or a laser annealing device. Here, the anneal is performed so that the position at the depth D3 where the n-type impurities were implanted in the buffer implantation is sufficiently heated. Further, the anneal is performed at a temperature at which a surface of the semiconductor substrate 12 does not melt. Due to this, the n-type impurities that were implanted in the buffer implantation are diffused and activated. Due to this, the buffer region 34 is formed in the semiconductor substrate 12 as shown in FIG. 5. That is, the buffer region 34 in which the n-type impurities are distributed in the Gauss distribution form as shown in FIG. 2 is formed by performing the buffer anneal. Since an average stop depth of the n-type impurities in the buffer implantation is the depth D3, the local maximum value N3 of the n-type impurity density is generated after the buffer anneal in the depth D3 as shown in FIG. 2. Further, the region on the upper surface 12a side than the buffer region 34 having the low n-type impurity density becomes the drift region 32.

Contact Implantation

Figure 6:
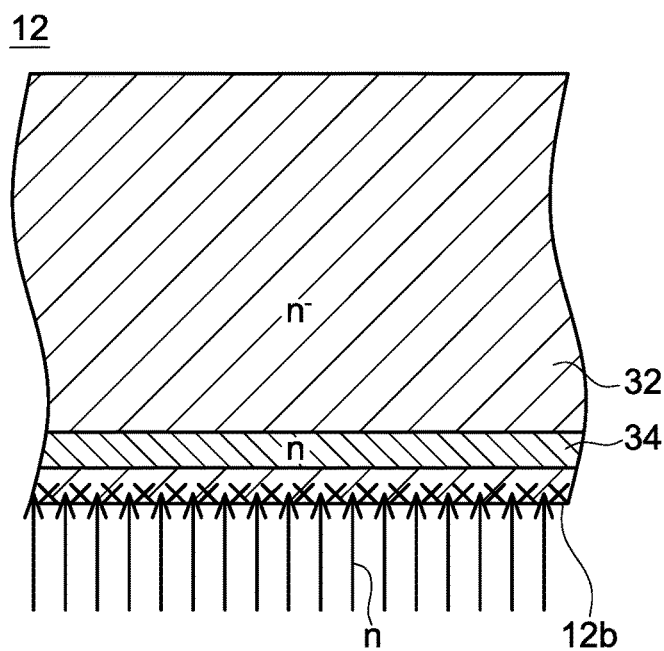
FIG. 6 is an explanatory diagram of the manufacturing process of the semiconductor device 10.

Next, as shown in FIG. 6, the n-type impurities are implanted to the lower surface 12b of the semiconductor substrate 12. Here, the implantation energy is adjusted so that the average position of the positions at which the n-type impurities are implanted is located at a position shallower than the buffer region 34. Further, in the contact implantation, the n-type impurities are implanted with a higher density than in the buffer implantation. Due to this, a region that had received the implantation of the n-type impurities in the contact implantation (that is, a region in a vicinity of the lower surface 12b) comes to have highly concentrated crystal defects.

Contact Anneal

Figure 7:
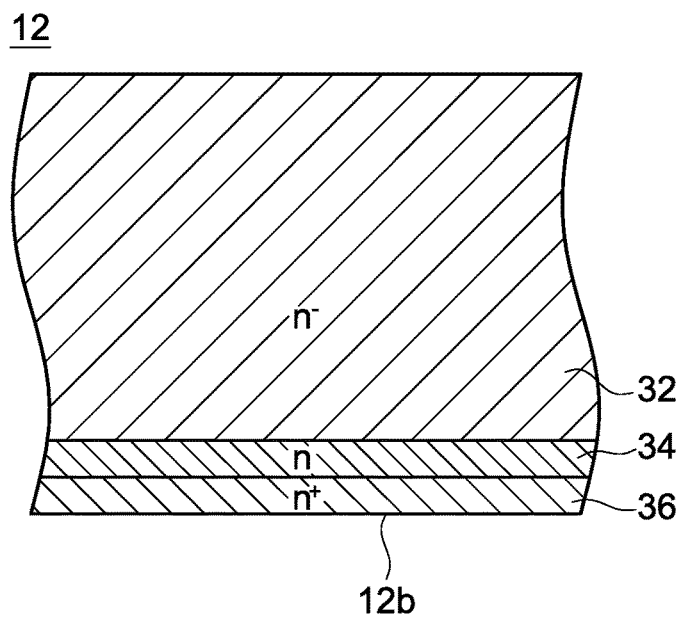
FIG. 7 is an explanatory diagram of the manufacturing process of the semiconductor device 10.

Next, the semiconductor substrate 12 is annealed by laser anneal. Here, the vicinity of the lower surface 12b is locally annealed by irradiating laser onto the lower surface 12b of the semiconductor substrate 12. More specifically, the laser anneal is performed within a short period of time so that not so much heat is transmitted to the buffer region 34. Further, the laser anneal is performed so that a temperature thereof rises to a level by which the semiconductor layer in the vicinity of the lower surface 12b is melted. More specifically, the laser anneal is performed so that a region on the deeper side (upper surface 12a side) than the depth D2 is not melted. The region 36 that was melted by the laser anneal is thereafter solidified, and recrystallized. The n-type impurities implanted in the contact implantation diffuse substantially uniformly within the region 36. Due to this, when the region 36 is recrystallized, the region 36 becomes the contact region 36, which contains the n-type impurities at high density. That is, as shown in FIG. 7, the contact region 36 is formed in a range exposed on the lower surface 12b of the semiconductor substrate 12.

As above, the n-type impurities diffuse substantially uniformly within the region 36 when the region 36 is melted in the contact anneal. On the other hand, the n-type impurities are hardly diffused in regions that were not melted. As a result of this, as shown in FIG. 2, a distribution in which the n-type impurity density does not change so much in the region between the lower surface 12b and the depth D1, and the n-type impurity density steeply decreases from the depth D1 toward the depth D2 is obtained. Thus, the shown distances "a", "b" come to satisfy the relationship of a>2b. As above, the contact region 36 having the box distribution is formed by performing the contact anneal. Since the region to be melted is limited to the region that is extremely shallow, a thickness of the contact region 36 becomes thin (depth D1 being 0.3 to 0.7 μm), so a peak density N1 in the contact region 36 becomes high. Further, in the process of melting the region 36 and thereafter solidifying it, majority of the crystal defects that were present at the high concentration in the region 36 are vanished. Due to this, the recrystallized contact region 36 has a reduced number of crystal defects. That is, by performing the contact anneal, the contact region 36 having a high n-type impurity density (more specifically, a high peak n-type impurity density N1) and a low crystal defect density is thereby formed. Notably, the contact anneal is performed so that the n-type impurity density N2 (see FIG. 2) satisfying the relationship of N3/10>N2>N4 is obtained after the contact anneal.

Next, the anode region 30 is formed by implanting p-type impurities into the upper surface 12a of the semiconductor substrate 12 and activating them. Then, the anode electrode 20 is formed on the upper surface 12a of the semiconductor substrate 12. Next, the cathode electrode 22 is formed on the lower surface 12b of the semiconductor substrate 12. The semiconductor device 10 as shown in FIG. 1 is completed by the above process.

As described above, according to the method of this embodiment, the contact region 36 having the high n-type impurity density and the low crystal defect density is formed. Thus, a diode with a low loss can be formed.

Further, in the method of the embodiment, the n-type impurities in the buffer region 34 are activated by an anneal (buffer anneal) that is different from the contact anneal that melts the surface. Due to this, the buffer region 34 can be formed at a deep position. Thus, the voltage resistance deterioration caused by scar and the like on the lower surface 12b can be suppressed.

Further, in the method of the embodiment, the contact anneal is performed so that the relationship of N2>N4 is satisfied. Due to this, the p-type region can be prevented from being formed in a vicinity of the depth D2. That is, there may be a case where p-type impurities are unintentionally adhered to the lower surface 12b of the semiconductor substrate 12 before being subjected to the contact anneal. In such a case, if the region 36 is melted in the contact anneal, the p-type impurities are diffused in the region 36. Thus, if the n-type impurity density is extremely low at the depth D2, the p-type impurity density may exceed the n-type impurity density in the vicinity of the depth D2, as a result of which a p-type region may be formed in the vicinity of the depth D2. However, with the method of the present embodiment, the contact anneal is performed so that the relationship of N2>N4 is satisfied (that is, the n-type impurity density N2 at the depth D2 becomes higher than the n-type impurity density N4 of the semiconductor substrate 12 being the base material). Due to this, the region in the vicinity of the depth D2 is less likely to become a p-type region even if a trivial amount of p-type impurities is diffused in the vicinity of the depth D2. Thus, the p-type region is prevented from being formed in the depth D2. Due to this, when the semiconductor device 10 is mass-produced using the method of the present embodiment, the diode properties (especially, VF) are stabilized.

Further, in the method of the embodiment, the diode is formed so that the relationship of N3/10>N2 is satisfied. Due to this, the stabilization of the diode properties is achieved. That is, if the n-type impurity density N2 at the depth D1 is too high, the contact region 36 and the buffer region 34 will function as one single region, as a result of which the n-type impurity density in the contact region 36 and the n-type impurity density in the buffer region 34 start to influence each other's properties. For example, if the n-type impurity density N2 is high, the inflow efficiency of the electrons from the cathode electrode 22 to the contact region 36 would change not only by the n-type impurity density of the contact region 36 but also by the n-type impurity density of the buffer region 34. Due to this, it becomes difficult to accurately control the electron inflow efficiency, and a large variation would be generated in the electron inflow efficiency among the semiconductor devices upon the mass production. Contrary to this, in the method of the present embodiment, the satisfaction of the relationship N3/10>N2 allows greater robustness in the electron inflow efficiency with respect to the influence from the buffer region 34. Thus, according to the method of the embodiment, a variation is less likely to occur in the electron inflow efficiency of the contact regions of the respective semiconductor devices upon the mass production.

Second Embodiment

Figure 8:
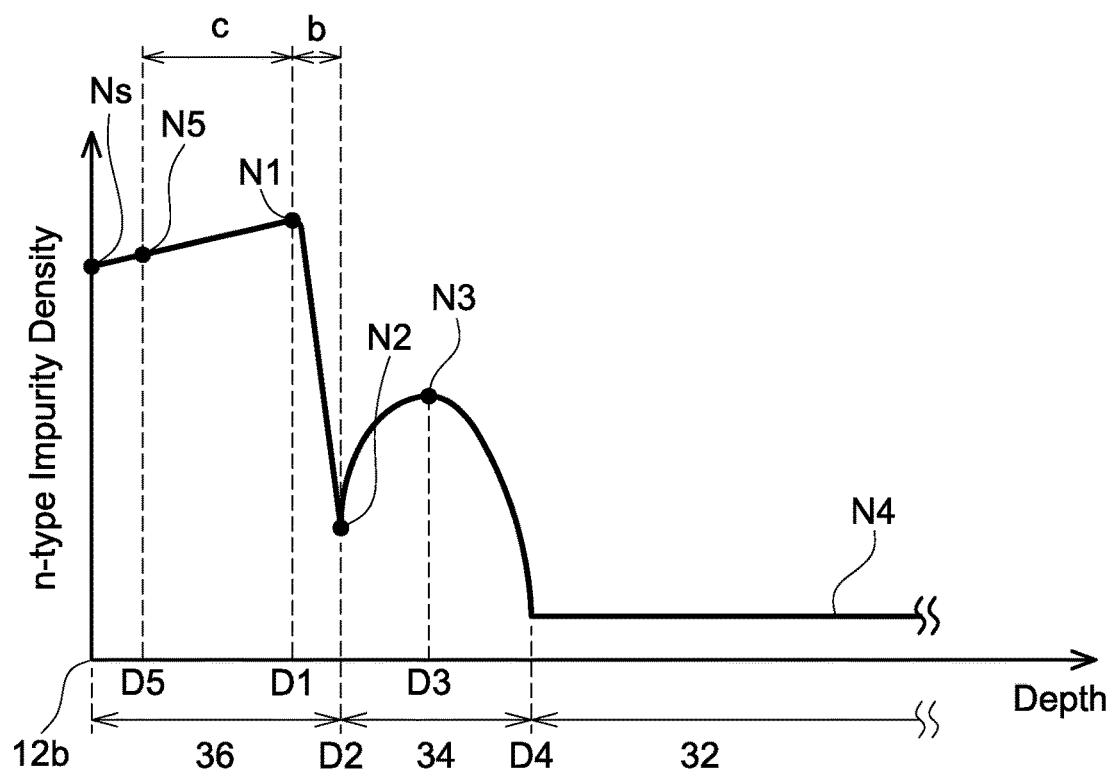
FIG. 8 is a graph of a semiconductor device of a second embodiment corresponding to FIG. 2.

In a semiconductor device of a second embodiment, as shown in FIG. 8, the n-type impurity density Ns at the lower surface 12b is low as compared to the first embodiment. In the second embodiment, N1/10>Ns is satisfied. Due to this, a depth D5 having an n-type impurity density N5, where N5=N1/10, exists in a region shallower than the depth D1.

In the second embodiment, a distance "c" from the depth D5 to the depth D1 satisfies a relationship of c>2b. The semiconductor device of the second embodiment is manufactured in a same method as in the first embodiment. Upon forming the contact region 36 having a relatively thick thickness by the method of melting the surface of the semiconductor substrate, there may be a case where the n-type impurity density Ns at the lower surface 12b becomes low as in the second embodiment. Even in such a case, in a typical box profile, the relationship of c>2b is satisfied. As above, in the case where the density Ns is low, the box profile can be defined by the distance "c" and the distance "b" (if the n-type impurity density Ns at the lower surface 12b satisfies Ns>N1/10 as in the first embodiment, the distance "a" between the lower surface 12b and the depth D1 simply needs to satisfy the relationship of a>2b). Even with the semiconductor device and the manufacturing method thereof of the second embodiment, substantially the same advantages as in the semiconductor device of the first embodiment can be obtained.

Next, semiconductor devices and manufacturing methods thereof of comparative examples will be described. Notably, the semiconductor devices of the comparative examples each have a contact region, a buffer region, a drift region, an anode region, a cathode electrode, and an anode electrode, similar to the first and second embodiments. In the semiconductor devices of the comparative examples, although impurity densities and dimensions of their regions may be different, the basic functionality of these regions are similar to the first and second embodiments. Thus, hereinbelow, parts having common features as the first and second embodiments will be described using the same reference signs as in the first and second embodiments. Further, the comparative examples hereinbelow were carried out by the inventors of the present application by experiments, and are not publicly known.

First Comparative Example

Figure 9:
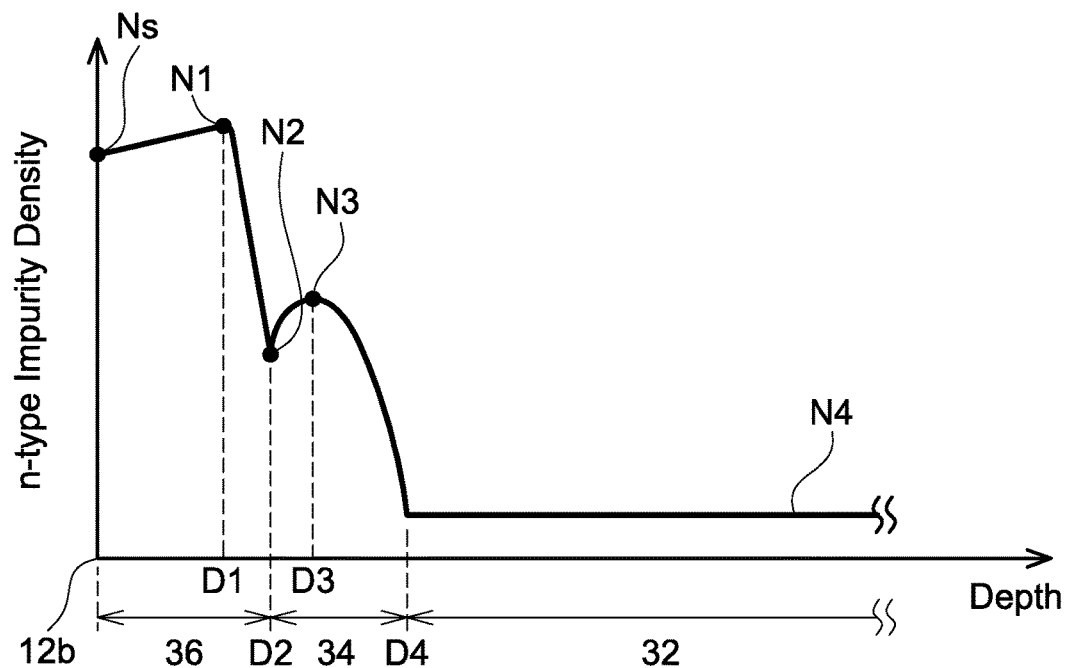
FIG. 9 is a graph of a semiconductor device of a first comparative example corresponding to FIG. 2.

FIG. 9 shows the n-type impurity density distribution in the contact region 36, the buffer region 34, and the drift region 32 in the semiconductor device of a first comparative example. In a manufacturing method of the semiconductor device of the first comparative example, firstly, the n-type impurities are implanted at the depth D3 in the semiconductor substrate. Next, the n-type impurities are implanted in the vicinity of the lower surface 12b of the semiconductor substrate 12 (for example, the depth D1). Then, the lower surface 12b of the semiconductor substrate 12 is melted by the laser anneal. At this occasion, the region extending to the depth D2 shown in FIG. 9 is melted. Due to this, the contact region 36 is formed. Further, although the region in the vicinity of the depth D3 is not melted, it is heated by the laser anneal. Due to this, the n-type impurities are activated in the vicinity of the depth D3, and the buffer region 34 is formed in the vicinity of the depth D3. Due to this, the semiconductor device in which the n-type impurities are distributed as shown in FIG. 9 is obtained. In the method of the first comparative example, the buffer region 34 is formed by the heat from the laser anneal, so the buffer region 34 needs to be formed at a position close to the lower surface 12b (that is, the depth D3 needs to be made shallow). Due to this, the buffer region 34 cannot be formed at a deep position. Thus, the semiconductor device of the first comparative example is prone to deteriorating its voltage resistance when a scar is formed on the lower surface 12b. Further, since the n-type impurity density at the depth D2 is high, the contact region 36 and the buffer region 34 are not sufficiently separated. Due to this, when the semiconductor device is mass-produced in this method, the variation in the inflow efficiency of the electrons to the contact region 36 tends to occur.

Second Comparative Example

Figure 10:
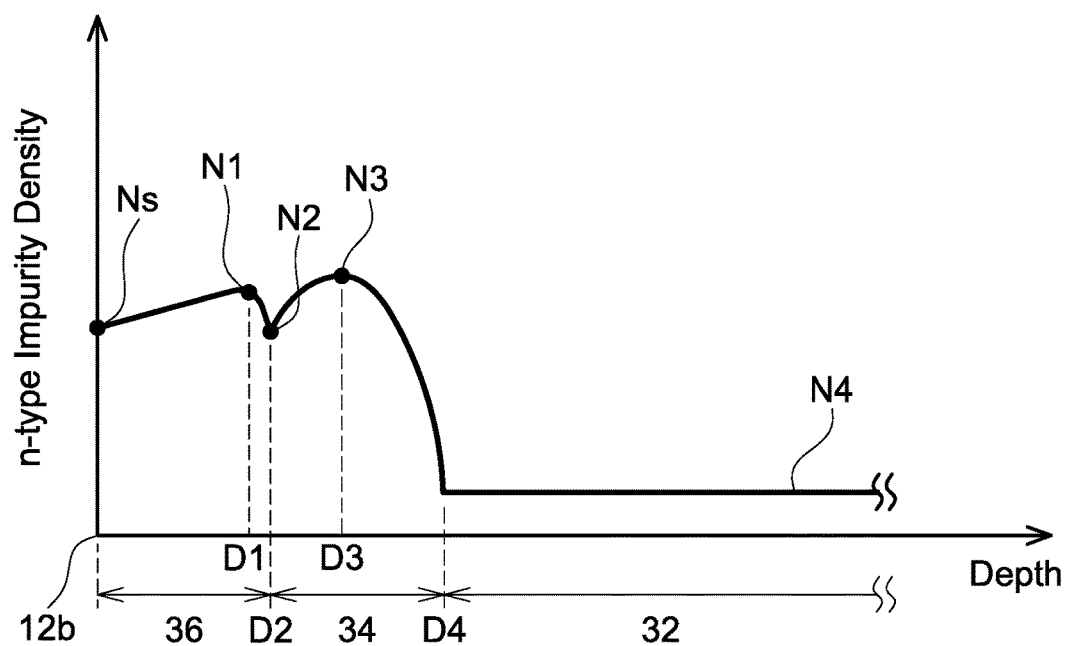
FIG. 10 is a graph of a semiconductor device of a second comparative example corresponding to FIG. 2.

FIG. 10 shows the n-type impurity density distribution in the contact region 36, the buffer region 34, and the drift region 32 in the semiconductor device of a second comparative example. A manufacturing method of the semiconductor device of the second comparative example is similar to the first comparative example. However, the implanting depth D3 of the n-type impurities in the buffer region 34 is deeper than the first comparative example. Further, in the laser anneal, the semiconductor substrate 12 is melted to a deeper position than in the first comparative example in order to activate the n-type impurities implanted to the depth D3, which is deeper than the first comparative example. Due to this, as shown in FIG. 10, the semiconductor device of the second comparative example has the buffer region 34 formed at a deeper position than in the first comparative example, whereas on the other hand the contact region 36 comes to have a wider width, and the n-type impurity density in the contact region 36 is lowered. Due to this, in the semiconductor device of the second comparative example, there is a problem that the contact resistance of the contact region 36 with respect to the cathode electrode 22 is high. Further, in the semiconductor device of the second comparative example as well, the local minimum value N2 is high, so the contact region 36 and the buffer region 34 are not separated sufficiently.

Third Comparative Example

Figure 11:
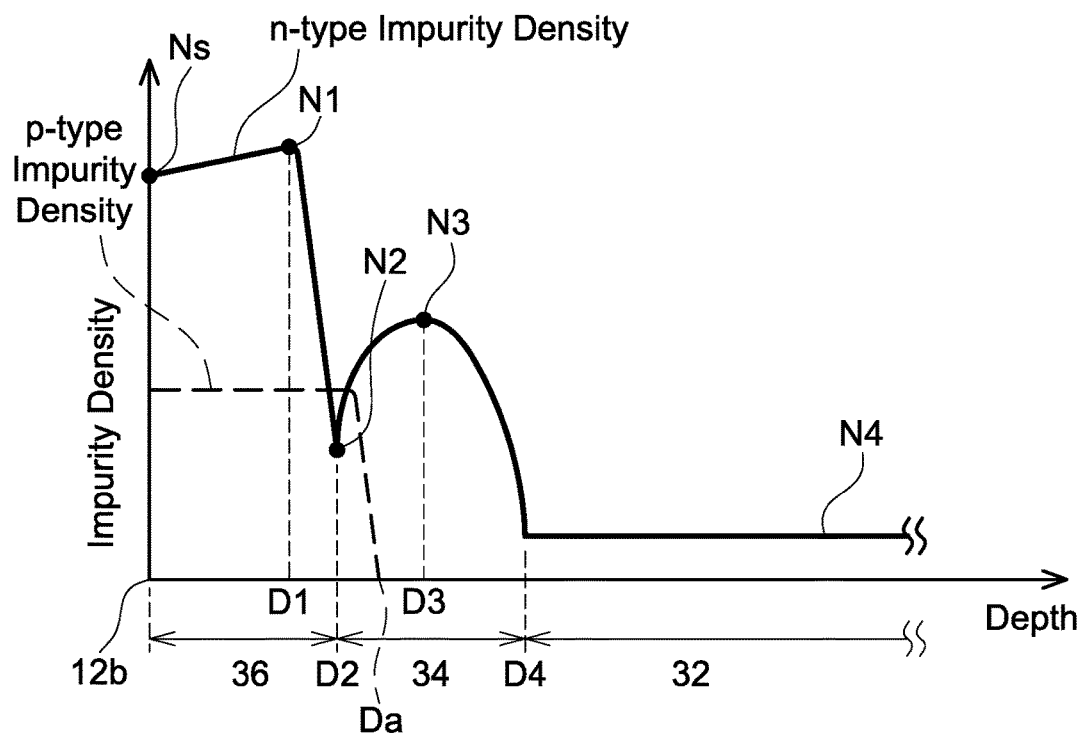
FIG. 11 is a graph of a semiconductor device of a third comparative example corresponding to FIG. 2.

FIG. 11 shows the n-type impurity density distribution in the contact region 36, the buffer region 34, and the drift region 32 in the semiconductor device of a third comparative example. In a manufacturing method of the semiconductor device of the third comparative example, the n-type impurities are implanted to the depth D3. The depth D3 of the third comparative example is similar to the depth D3 of the first embodiment. Then, the lower surface 12b of the semiconductor substrate 12 is melted by the laser anneal. Here, the region at the depth D3 are not melted, however, the depth D1 is heated by melting up to a depth (depth Da in FIG. 11) in the vicinity of the depth D1. Due to this, the impurities implanted in the depth D1 are diffused, and the buffer region 34 is thereby formed. Then, the n-type impurities are implanted to a depth in the vicinity of the lower surface 12b of the semiconductor substrate 12. Then, the lower surface 12b of the semiconductor substrate 12 is melted by the laser anneal. That is, only the region shallower than the depth Da is melted, and the n-type impurities are diffused in that melted region. Due to this, the contact region 36 is formed. According to the method of the third comparative example, the contact region 36 having the high re-type impurity density and the buffer region 34 formed at the deep position as shown in FIG. 11 can be facilitated. However, according to the method of the third comparative example, if the p-type impurities are unintentionally adhered to the lower surface 12b of the semiconductor substrate 12, the p-type impurities are diffused in the melting region in the initial laser anneal (laser anneal to melt up to the depth Da). Due to this, as shown in FIG. 11, there is a case where the p-type impurities are diffused in the region from the lower surface 12b to the depth Da. When this happens, the p-type impurity density may exceed the n-type impurity density at the depth D2 having the local minimum value N2 of n-type impurities. That is, there is a case where the p-type region may be formed between the contact region 36 and the buffer region 34. As above, in the method of the third comparative example, the p-type region may be formed between the contact region 36 and the buffer region 34, and the diode properties may not be stabilized upon the mass production.

In the methods of the first and second embodiments, none of the problems mentioned in the above first to third comparative examples occurs, and semiconductor devices having quality properties may be manufactured stably.

Notably, in the aforementioned first and second embodiments, the buffer implantation, the buffer anneal, the contact implantation, and the contact anneal are performed in this order, however, the order by which these processes are performed may be changed. The order may be changed arbitrarily so long as the buffer anneal is performed after the buffer implantation, and the contact anneal is performed after the contact implantation.

Figure 12:
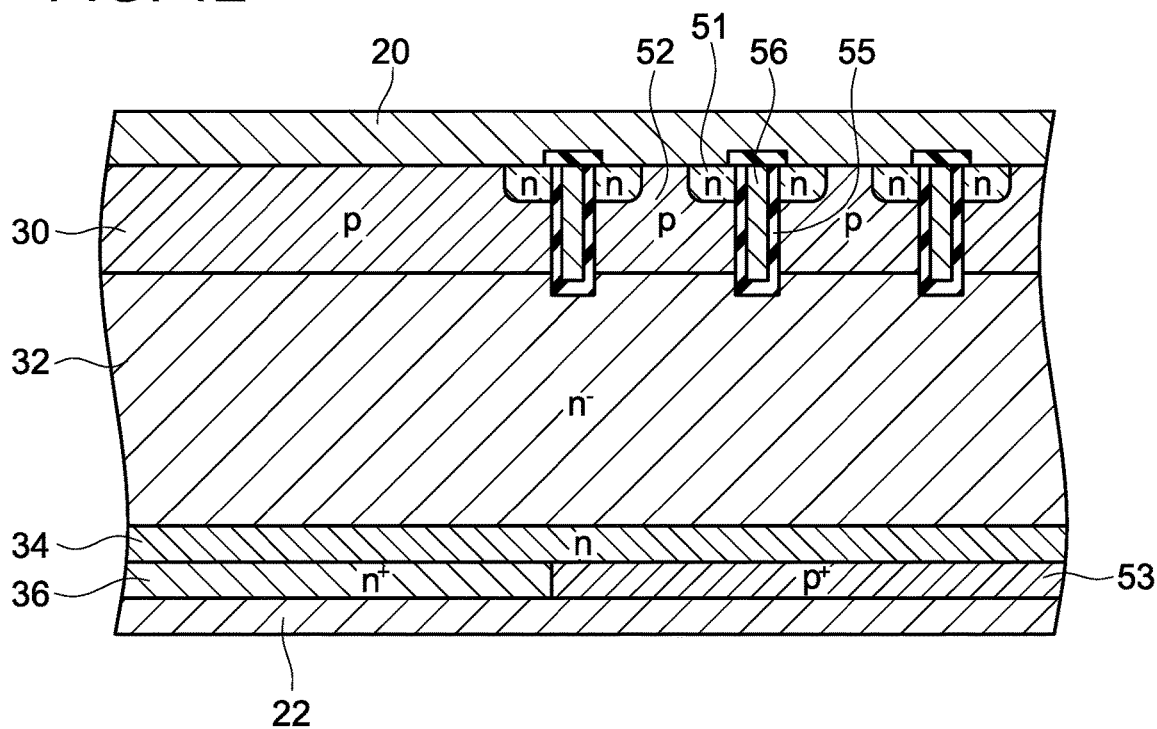
FIG. 12 is a vertical cross sectional view of an RC-IGBT that adapts the technique disclosed in this description.

Further, in the aforementioned embodiments, the semiconductor device in which only the diode is provided has been described, however, the aforementioned technique may be applied to a diode portion of an RC-IGBT in which a diode and an IGBT are provided on a single semiconductor substrate. Notably, as such an RC-IGBT, a configuration shown in FIG. 12 may be exemplified. In FIG. 12, reference signs 20 to 22 and 30 to 36 correspond to the first embodiment. Further, a reference sign 51 is an emitter region, a reference sign 52 is a body region, a reference sign 53 is a collector region, a reference sign 55 is a gate insulating film, and a reference sign 56 is a gate electrode. The IGBT is configured by these constituent features 51 to 56, and the regions 32 and 34. Further, the anode electrode 20 serves also as an emitter electrode of the IGBT, and the cathode electrode 22 serves also as a collector electrode of the IGBT.

Further, in the aforementioned embodiments, the diode had been described, however, the aforementioned technique may be applied to a contact portion between a source region and a source electrode, or to a contact portion between a drain region and a drain electrode of a FET (for example, MOSFET).

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

The invention claimed is:

1. A semiconductor device, comprising a first conductivity type region exposed on a surface of a semiconductor substrate,
wherein
a local maximum value N1, a local minimum value N2, and a local maximum value N3 exist in a density distribution of first conductivity type impurities in the first conductivity type region measured along a thickness direction of the semiconductor substrate,
a depth having the local maximum value N1 is located on the surface side with respect to a depth having the local minimum value N2,
a depth having the local maximum value N3 is located on an opposite side of the surface with respect to the depth having the local minimum value N2,
a region having a density N4 of the first conductivity type impurities is located in a part of the first conductivity type region located on an opposite side of the surface with respect to the depth having the local maximum value N3,
a relationship of N1>N3>N2>N4 is satisfied,
a relationship of N3/10>N2 is satisfied, and
a distance "a" from the surface to the depth having the local maximum value N1 is larger than twice a distance "b" from the depth having the local maximum value N1 to the depth having the local minimum value N2.

2. The semiconductor device of claim 1, wherein
a depth having a density N5 of the first conductivity type impurities is located on the surface side with respect to the depth having the local maximum value N1, the density N5 is one tenth of the local maximum value N1, and
a distance "c" from the depth having the density N5 to the depth having the local maximum value N1 is larger than twice the distance "b".

3. The semiconductor device of claim 1, wherein
a diode is provided in the semiconductor substrate, and
the first conductivity type region is a cathode region of the diode.

4. The semiconductor device of claim 3, wherein an IGBT is further provided in the semiconductor substrate.

5. The semiconductor device of claim 1, wherein
a MOSFET is provided in the semiconductor substrate, and
the first conductivity type region is a source region or a drain region of the MOSFET.

6. A method for manufacturing a semiconductor device, comprising:
a first implantation for implanting first conductivity type impurities into a surface of a semiconductor substrate of a first conductivity type,
heat treating the semiconductor substrate after the first implantation at a temperature at which the semiconductor substrate does not melt,
a second implantation for implanting first conductivity type impurities into the surface of the semiconductor substrate at an energy lower than in the first implantation and at a density higher than in the first implantation, and
melting, after the second implantation, a region located on the surface side with respect to an average position of positions at which the first conductivity type impurities stop in the first implantation and then solidifying the region.

* * * * *